(12) United States Patent
Lu et al.

(10) Patent No.: US 10,295,603 B2
(45) Date of Patent: May 21, 2019

(54) ELECTRONIC DEVICE AND METHOD FOR DISPLAYING REMAINING BATTERY CAPACITY OF THE ELECTRONIC DEVICE

(71) Applicant: AMBIT MICROSYSTEMS (SHANGHAI) LTD., Shanghai (CN)

(72) Inventors: Chia-Ning Lu, Taoyuan (TW); Hsin-Ta Chiang, Taoyuan (TW)

(73) Assignee: AMBIT MICROSYSTEMS (SHANGHAI) LTD., Shanghai (CN)

( * ) Notice: Subject to any disclaimer, the term of this patent is extended or adjusted under 35 U.S.C. 154(b) by 380 days.

(21) Appl. No.: 14/953,967

(22) Filed: Nov. 30, 2015

(65) Prior Publication Data
US 2017/0023650 A1    Jan. 26, 2017

(30) Foreign Application Priority Data

Jul. 22, 2015 (TW) .............................. 104123789 A

(51) Int. Cl.
*G01R 31/36* (2019.01)
(52) U.S. Cl.
CPC ................................ *G01R 31/3689* (2013.01)
(58) Field of Classification Search
None
See application file for complete search history.

(56) References Cited

U.S. PATENT DOCUMENTS 9,720,384 B2 * 8/2017 Honda ................... G04R 20/04
2017/0350946 A1 * 12/2017 Mukaitani .......... G01R 31/3679

FOREIGN PATENT DOCUMENTS

| CN | 103761179 A | 4/2014 |
| CN | 104301547 A | 1/2015 |
| TW | 200407552 A | 5/2004 |
| TW | 200605736 A | 2/2006 |
| TW | 201334358 A1 | 8/2013 |

* cited by examiner

*Primary Examiner* — Aditya S Bhat
(74) *Attorney, Agent, or Firm* — ScienBiziP, P.C.

(57) ABSTRACT

A method for displaying remaining battery capacity of an electronic device includes calculating remaining capacity of the battery for a number of predetermined times during a preset interval when a first difference value is greater than a predetermined value. The first difference value is between a first remaining capacity and a second remaining capacity. The first remaining capacity of the electronic device is recorded before turning off the electronic device, and the second remaining capacity of the electronic device after turning on the electronic device. The latest calculated remaining capacity during the preset interval is displayed on the display device when a second difference between each calculated remaining capacity and the first remaining capacity is greater than the predetermined value.

9 Claims, 3 Drawing Sheets

ELECTRONIC DEVICE AND METHOD FOR DISPLAYING REMAINING BATTERY CAPACITY OF THE ELECTRONIC DEVICE

CROSS-REFERENCE TO RELATED APPLICATIONS

This application claims priority to Taiwan Patent Application No. 104123789 filed on Jul. 22, 2015, the contents of which are incorporated by reference herein.

FIELD

The subject matter herein generally relates to battery power technology, and particularly to an electronic device and a method for displaying battery capacity of an electronic device.

BACKGROUND

An electronic device (for example, a mobile phone) can calculate battery capacity by a fuel gauge Integrated Circuit (IC). A basic function of the fuel gauge IC is to monitor the voltage, charge/discharge current and battery temperature, and to estimate Full Charge Capacity (FCC) of the battery.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
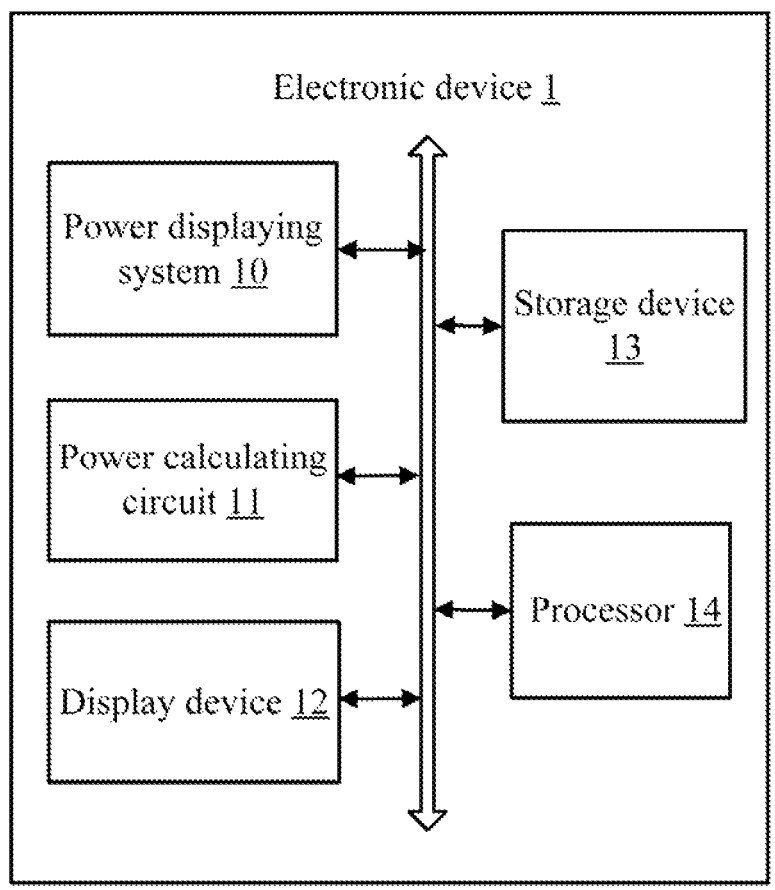
FIG. 1 is a block diagram of an example embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure, including the accompanying drawings, is illustrated by way of examples and not by way of limitation. It should be noted that references to "an" or "one" embodiment in this disclosure are not necessarily to the same embodiment, and such references mean "at least one."

The term "module", as used herein, refers to logic embodied in hardware or firmware, or to a collection of software instructions, written in a programming language, such as, Java, C, or assembly. One or more software instructions in the modules can be embedded in firmware, such as in an EPROM. The modules described herein can be implemented as either software and/or hardware modules and can be stored in any type of non-transitory computer-readable medium or other storage device. Some non-limiting examples of non-transitory computer-readable media include CDs, DVDs, BLU-RAY™ flash memory, and hard disk drives. The term "comprising" means "including, but not necessarily limited to"; it specifically indicates open-ended inclusion or membership in a so-described combination, group, series and the like.

FIG. 1 is a block diagram of an example embodiment of an electronic device. In at least one embodiment as shown in FIG. 1, an electronic device 1 includes a power displaying system 10. The electronic device 1 can be a smart phone, a personal digital assistant (PDA), a tablet computer, or any other suitable electronic device. The electronic device 1 further includes, but is not limited to, a power calculating circuit 11, a display device 12, a storage device 13, and at least one processor 14. The power calculating circuit 11, the display device 12, and the storage device 13, coupled to the at least one processor 14. FIG. 1 illustrates only one example of the electronic device, other examples can include more or fewer components than illustrated, or have a different configuration of the various components in other embodiments.

In at least one embodiment, the power calculating circuit 11 can be configured to calculate remaining capacity of a battery of the electronic device 1, and transmit the remaining capacity to a Integrated Circuit (IC) gauge for displaying a state of the remaining capacity. The display device 12 can display remaining capacity of the battery of the electronic device 1. In at least one embodiment, the display device 12 can be a flat panel display, such as a Liquid Crystal Display (LCD), a plasma screen, or an Organic Light Emitting Diode display (OLED) screen.

In at least one embodiment, the storage device 13 can include various types of non-transitory computer-readable storage mediums. For example, the storage device 13 can be an internal storage system, such as a flash memory, a random access memory (RAM) for temporary storage of information, and/or a read-only memory (ROM) for permanent storage of information. The storage device 13 can also be an external storage system, such as a hard disk, a storage card, or a data storage medium. In at least one embodiment, the at least one processor 14 can be a central processing unit (CPU), a microprocessor, or other data processor chip that performs functions of the electronic device 1.

The power displaying system 10 can calculate remaining capacity of a battery of the electronic device 1 for predetermined times during a preset interval, and display the calculated remaining battery capacity on a display device 12 of the electronic device 1.

Figure 2:
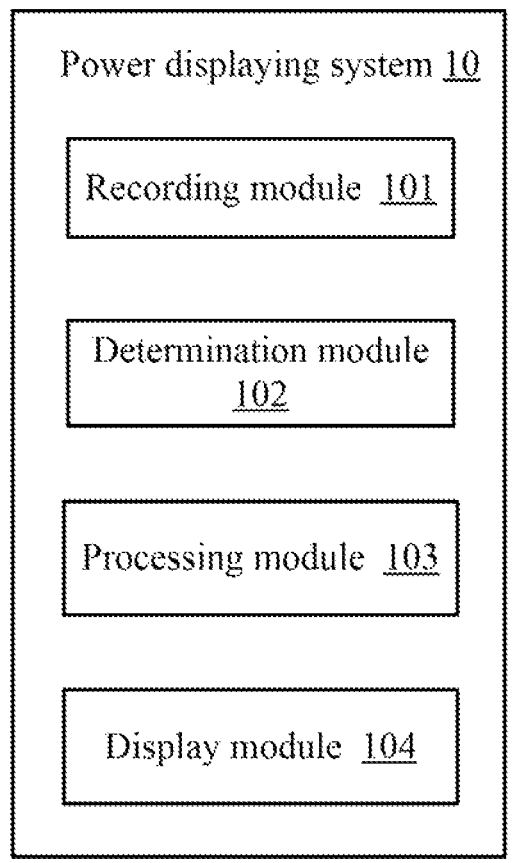
FIG. 2 is a block diagram of an example embodiment of modules of a power displaying system.

FIG. 2 is a block diagram of one embodiment of modules of the power displaying system 10. In at least one embodiment, the power displaying system 10 can include a recording module 101, a determination module 102, a processing module 103, and a display module 104. The modules 101, 102, 103, and 104 can include computerized codes in the form of one or more programs which are stored in the storage device 13. The at least one processor 14 executes the computerized codes to of the modules 101-104.

The recording module 101 can record a first remaining capacity of the battery before turning off the electronic device 1. In at least one embodiment, the power calculating circuit 11 can calculate the remaining capacity of the battery, and display the remaining capacity on the display device 12. The recording module 101 further can store the first remaining capacity into the storage device 13.

The recording module 101 can record a second remaining capacity of the battery after turning on the electronic device 1.

The determination module 102 can determine whether a first difference value between the first remaining capacity and the second remaining capacity is greater than a predetermined value. When the first difference value is greater than the predetermined value, it can be determined that the battery of the electronic device 1 is recharging or has voltage impulse problems. When the first difference value is less than or equal to the predetermined value, it can be determined that the remaining capacity of the battery of the electronic device 1 is normal. In at least one embodiment, the predetermined value is three percent of the first remaining capacity.

The processing module 103 can calculate the remaining capacity for predetermined times during a preset interval to get a plurality of calculated remaining capacity after turning on the electronic device 1. For example, the processing module 103 calculates the remaining capacity ten times every ten seconds.

The determination module 102 can determine whether a second difference value between each calculated remaining capacity and the first remaining capacity is greater than the predetermined value. When the second difference value is greater than the predetermined value, it can be determined that the remaining capacity of the battery of the electronic device 1 has changed. For example, the battery may be recharged when the electronic device 1 is turned off. When the second difference value is less than or equal to the predetermined value, it can be determined that the remaining capacity of the battery of the electronic device 1 has been barely changed.

When the second difference value is greater than the predetermined value, the display module 104 can display the latest calculated remaining capacity during the preset interval on the display device 12.

When the second difference value is less than or equal to the predetermined value, the display module 104 can display the first calculated remaining capacity during the preset interval on the display device 12.

Figure 3:
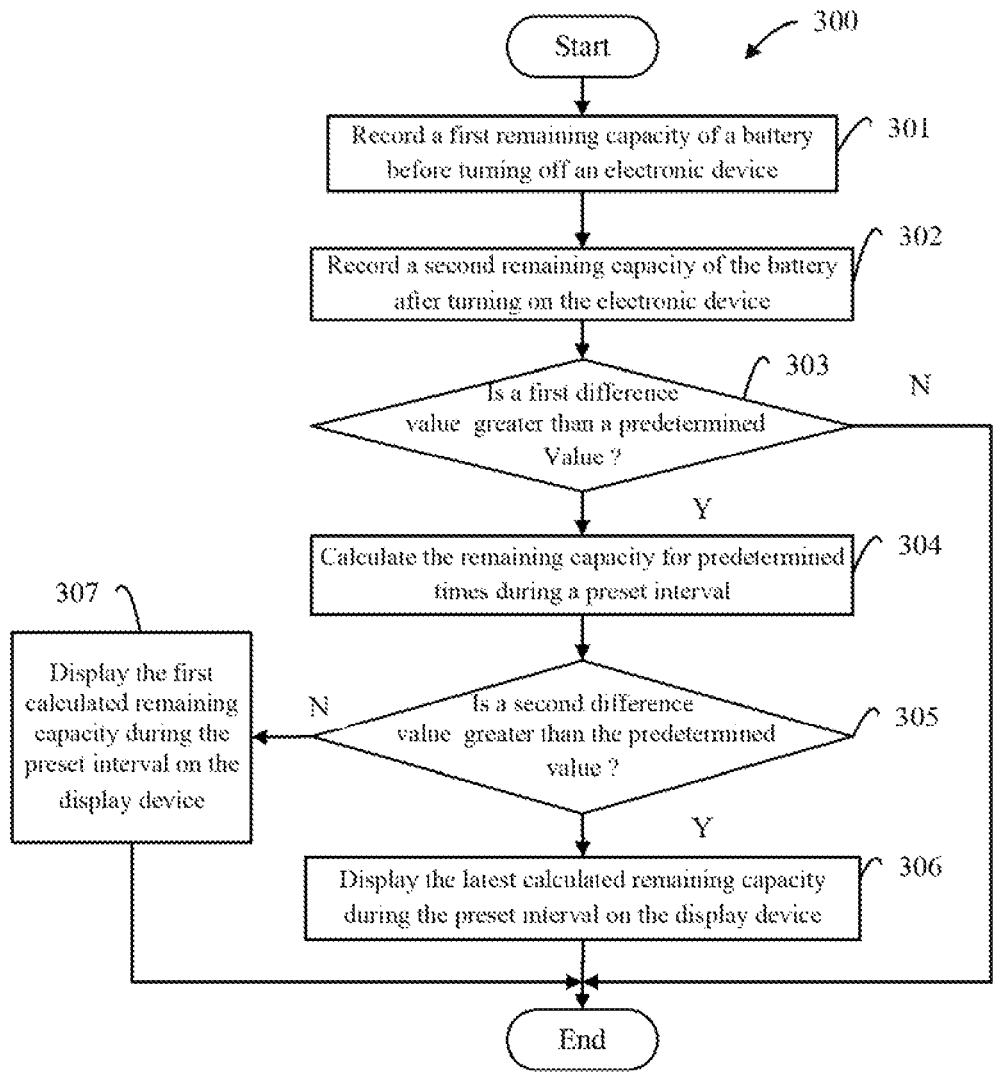
FIG. 3 is a flowchart of an example embodiment of a method for displaying remaining capacity of the electronic device.

FIG. 3 illustrates a flowchart is presented in accordance with an example embodiment. An example method 300 is provided by way of example, as there are a variety of ways to carry out the method. The example method 300 described below can be carried out using the configurations illustrated in FIG. 1 and FIG. 2, and various elements of these figures are referenced in explaining the example method. Each block shown in FIG. 3 represents one or more processes, methods, or subroutines, carried out in the example method 300. Furthermore, the illustrated order of blocks is illustrative only and the order of the blocks can be changed according to the present disclosure. The example method 300 can begin at block 301. Depending on the embodiment, additional blocks can be utilized and the ordering of the blocks can be changed.

At block 301, a recording module can record a first remaining capacity of the battery before turning off the electronic device 1. In at least one embodiment, the power calculating circuit 11 can calculate the remaining capacity of the battery, and display the remaining capacity on the display device 12. The recording module can further store the first remaining capacity in the storage device 13.

At block 302, the recording module can record a second remaining capacity of the battery after turning on the electronic device 1.

At block 303, a determination module can determine whether a first difference value between the first remaining capacity and the second remaining capacity is greater than a predetermined value. When the first difference value is greater than the predetermined value, it can be determined that the battery of the electronic device 1 is recharging or has voltage impulse problems, the procedure goes to block 304. When the first difference value is less than or equal to the predetermined value, it can be determined that the remaining capacity of the battery of the electronic device 1 is normal, the procedure ends. In at least one embodiment, the predetermined value is three percent of the first remaining capacity.

At block 304, a processing module can calculate the remaining capacity for predetermined times during a preset interval to get a plurality of calculated remaining capacity after turning on the electronic device 1. For example, the processing module calculates the remaining capacity ten times every ten seconds.

At block 305, the determination module can determine whether a second difference value between each calculated remaining capacity and the first remaining capacity is greater than the predetermined value. When the second difference value is greater than the predetermined value, it can be determined that the remaining capacity of the battery of the electronic device 1 has changed, the procedure goes to block 306. When the second difference value is less than or equal to the predetermined value, it can be determined that the remaining capacity of the battery of the electronic device 1 has barely been changed, the procedure goes to block 307.

When the second difference value is greater than the predetermined value, at block 306, a display module can display latest calculated remaining capacity during the preset interval on the display device 12.

When the second difference value is less than or equal to the predetermined value, at block 307, the display module can display the first calculated remaining capacity during the preset interval on the display device 12.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. An electronic device comprising:
   a display device;
   at least one processor; and
   a storage device, wherein the storage device stores one or more programs, executable by the at least one processor, to cause the at least one processor to:
   record a first remaining capacity of a battery of the electronic device before turning off the electronic device;
   record a second remaining capacity of the battery after turning on the electronic device;

determine whether a first difference value between the first remaining capacity and the second remaining capacity is greater than a predetermined value;

calculate the remaining capacity of the battery for predetermined times during a preset interval to obtain a plurality of calculated remaining capacity if the first difference value is greater than the predetermined value;

determine whether a second difference value is greater than the predetermined value, wherein the second difference value is between each calculated remaining capacity and the first remaining capacity; and display the latest calculated remaining capacity during the preset interval on the display device if the second difference value is greater than the predetermined value, wherein it is determined that the battery of the electronic device is recharging or voltage impulse of the electronic device is abnormal when the first difference value is greater than the predetermined value.

2. The electronic device according to claim 1, wherein the programs further cause the at least one processor to:

display the first calculated remaining capacity during the preset interval on the display device if the second difference value is less than or equal to the predetermined value.

3. The electronic device according to claim 1, wherein the predetermined value is three percent of the first remaining capacity.

4. A computer-implemented method for displaying remaining capacity of an electronic device being executed by at least one processor of the electronic device, the method comprising:

recording a first remaining capacity of a battery of the electronic device before turning off the electronic device;

recording a second remaining capacity of the battery after turning on the electronic device;

determining whether a first difference value between the first remaining capacity and the second remaining capacity is greater than a predetermined value;

calculating the remaining capacity of the battery for predetermined times during a preset interval to obtain a plurality of calculated remaining capacity if the first difference value is greater than the predetermined value;

determining whether a second difference value is greater than the predetermined value, wherein the second difference value is between each calculated remaining capacity and the first remaining capacity; and displaying the latest calculated remaining capacity during the preset interval on the display device if the second difference value is greater than the predetermined value, wherein it is determined that the battery of the electronic device is recharging or voltage impulse of the electronic device is abnormal when the first difference value is greater than the predetermined value.

5. The method according to claim 4, further comprising:

displaying the first calculated remaining capacity during the preset interval on the display device if the second difference value is less than or equal to the predetermined value.

6. The method according to claim 4, wherein the predetermined value is three percent of the first remaining capacity.

7. A non-transitory storage medium having stored thereon instructions that, when executed by a processor of an electronic device, causes the processor to perform a displaying method using the electronic device, the method comprising:

recording a first remaining capacity of a battery of the electronic device before turning off the electronic device;

recording a second remaining capacity of the battery after turning on the electronic device;

determining whether a first difference value between the first remaining capacity and the second remaining capacity is greater than a predetermined value;

calculating the remaining capacity of the battery for predetermined times during a preset interval to obtain a plurality of calculated remaining capacity if the first difference value is greater than the predetermined value;

determining whether a second difference value is greater than the predetermined value, wherein the second difference value is between each calculated remaining capacity and the first remaining capacity; and displaying the latest calculated remaining capacity during the preset interval on the display device if the second difference value is greater than the predetermined value, wherein it is determined that the battery of the electronic device is recharging or voltage impulse of the electronic device is abnormal when the first difference value is greater than the predetermined value.

8. The non-transitory storage medium according to claim 7, wherein the method further comprises:

displaying the first calculated remaining capacity during the preset interval on the display device if the second difference value is less than or equal to the predetermined value.

9. The non-transitory storage medium according to claim 7, wherein the predetermined value is three percent of the first remaining capacity.

* * * * *